(12) United States Patent  
Takase (10) Patent No.: US 7,400,213 B2  
(45) Date of Patent: Jul. 15, 2008

(54) SYSTEM AND METHOD FOR CONFIGURING CONDUCTORS WITHIN AN INTEGRATED CIRCUIT TO REDUCE IMPEDANCE VARIATION CAUSED BY CONNECTION BUMPS

(75) Inventor: Satoru Takase, Round Rock, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 11/137,296

(22) Filed: May 25, 2005

(65) Prior Publication Data

US 2006/0267706 A1    Nov. 30, 2006

(51) Int. Cl.  
*H03H 7/38* (2006.01)

(52) U.S. Cl. .................. 333/33; 257/692; 257/698; 257/737

(58) Field of Classification Search .................. 333/33; 257/690, 692, 698, 737, 735, 734  
See application file for complete search history.

(56) References Cited

U.S. PATENT DOCUMENTS 5,523,622 A * 6/1996 Harada et al. ............... 257/734

FOREIGN PATENT DOCUMENTS

| JP | 08-306696 | 11/1996 |
|---|---|---|
| JP | 2002-280453 | 9/2002 |
| JP | 2003-152081 | 5/2003 |

* cited by examiner

*Primary Examiner*—Stephen E Jones  
(74) *Attorney, Agent, or Firm*—Sprinkle IP Law Group (57) ABSTRACT

Systems and methods for improved semiconductor device performance are disclosed. In particular, presented are improved semiconductor systems and methods for configuring conductors to reduce impedance variation caused by proximity and/or density and/or operation of connection-bumps. The invention includes adding impedance-reducing conductive features which add no additional functionality to the semiconductor device. The added features may be arranged in areas of sparse connection-bump density. Impedance-reducing conductive features may include metal lines added between functional metal lines, where placement between adjacent functional lines may vary. Impedance-reducing conductive features may be added to any one or combination of conductive layers, and added features may act upon any one or combination of functional features. Further, added features may be electrically active and responsive to semiconductor device operation. Also, methods for determining connection-bump density, which methods may be automated.

33 Claims, 4 Drawing Sheets

SYSTEM AND METHOD FOR CONFIGURING CONDUCTORS WITHIN AN INTEGRATED CIRCUIT TO REDUCE IMPEDANCE VARIATION CAUSED BY CONNECTION BUMPS

TECHNICAL FIELD OF THE INVENTION

The invention relates in general to systems and methods for configuring conductors within an integrated circuit. More specifically, it relates to providing a stable semiconductor device power network by reducing impedance variation within metal power lines caused by connection-bumps on the semiconductor device.

BACKGROUND OF THE INVENTION

The demand for faster and smaller microelectronic devices is driving continual shrinkage of microelectronic architectures. Such microelectronic architectures form the electronic circuits of semiconductor devices. Semiconductor devices are manufactured on silicon wafers using a process of adding layers and selectively removing parts of the layers. Semiconductor device features are created through this selective removal process. Upon the completion of the manufacturing process, the silicon wafers are cut into individual dies where each die includes at least one complete semiconductor device.

Individual dies are not typically directly integrated into electronic devices, such as, for example, cellular phones. Typically, the dies are first packaged. Thus, semiconductor devices may include connection-bumps which function to electrically couple the semiconductor device with its respective package. Once these connection-bumps have coupled a semiconductor device to a package, the packaged semiconductor device may be inserted into and used by an electronic device.

Included among the layers which comprise a semiconductor device is at least one layer of conductors, such as metal lines. Metal lines may be used within the semiconductor device to connect elements of the integrated circuit. For example, metal lines may carry electrical current to and from logic gates. Also, a power network for the semiconductor device may include metal lines. Due to the continued-shrinkage of microelectronic architectures, optimal semiconductor device operation depends upon optimal performance of each semiconductor feature. Thus, stable functionality of the metal lines contributes to optimal functionality of the semiconductor device. However, the connection-bumps which electrically couple a semiconductor device to a package may affect performance of the semiconductor device. In particular, the impedance of conductive device features can be affected by the presence and/or operation of connection-bumps. For example, a metal line traversing an area with a high connection-bump density may have impedance which differs significantly from that of a similar metal line traversing an area with a lower connection-bump density. Because varying line impedance can negatively affect semiconductor device performance, it is desirable to reduce such variation in line impedance. Therefore, a need exists for improved methods of configuring semiconductor devices, and improved semiconductor devices.

SUMMARY OF THE INVENTION

Methods and devices yielding improved semiconductor devices are disclosed. In particular, line impedance variation induced by the presence of connection-bumps may be reduced by configuring impedance-reducing metal lines according to connection-bump densities.

The present invention relates to a semiconductor device, and more particularly, to adding conductors to a semiconductor device having connection-bumps used for device packaging terminations. Presented are improved semiconductor systems and methods for configuring conductors to reduce impedance variation caused by proximity and/or density and/or operation of connection-bumps. The invention includes adding impedance-reducing conductive features which may add no additional functionality to the semiconductor device. The added features may be arranged in areas of sparse connection-bump density. Impedance-reducing conductive features may include metal lines added between functional metal lines, with placement between adjacent functional lines varying by respective embodiment. Impedance-reducing conductive features may be added to any one or combination of conductive layers, and added features may act upon any one or combination of functional features. Further, added features may be electrically active and responsive to semiconductor device operation. Also, methods for determining connection-bump density, which methods may be automated.

In one embodiment, a semiconductor device having at least one functional conductor and at least one impedance-reducing conductor adapted to reduce impedance variation in the at least one functional conductor. The at least one functional conductor is configured to hold an electric potential. The functional conductors may include functional metal lines, and the impedance-reducing conductors may include impedance-reducing metal lines. The device may include connection bumps, and the impedance-reducing metal lines may be arranged where the connection bumps are sparsely distributed.

In another embodiment, a semiconductor device having connection-bumps where at least one connection-bump is configured to hold an electric potential. The connection bumps are arranged sparsely in some areas and densely in other areas. The semiconductor device also includes a plurality of functional metal lines where at least one functional metal line is coupled to the at least one connection-bump holding an electric potential. Finally, the semiconductor device also includes a plurality of impedance-reducing metal lines configured to reduce impedance variation of at least one functional metal line. In the embodiment, the impedance-reducing metal lines may be arranged substantially within a sparse area and parallel with adjacent functional metal lines. Each impedance-reducing metal line may be equidistant from a corresponding functional metal line.

In one embodiment, a method of reducing impedance variation in a semiconductor device which includes forming at least one functional conductor and forming at least one impedance-reducing conductor configured to reduce impedance variation of the at least one functional conductor. In the embodiment, forming conductors may include forming metal lines. The embodiment may also include forming connection bumps. The impedance-reducing metal lines and the connection-bumps may not be equally distributed across the semiconductor device, and their respective distributions may be inversely related. Also, the impedance-reducing lines may be formed having corresponding functional metal lines.

A technical advantage of the invention is the ability to stabilize the power network. For example, semiconductor devices using connection-bumps for I/O and power connections may have connection-bumps over the majority of the semiconductor device. However, some constraints prevent arranging connection-bumps in all areas of the semiconductor device. Such areas having a lower density of power bumps generally have bigger power bounce during semiconductor device operation, and such power bounce leads to semiconductor device malfunction.

This invention provides the ability to normalize metal line impedance in view of semiconductor features or operational characteristics which may influence impedance. Such equalized line impedance may reduce excessive voltage-drop which may interfere with semiconductor device function. For example, logic gate operation and/or device timing may be affected by excessive voltage drop. Therefore, excessive power bounce may be eliminated through use of this invention.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating preferred embodiments of the invention, are given by way of illustration only and not by way of limitation. After reading the specification, various substitutions, modifications, additions and rearrangements will become apparent to those skilled in the art from this disclosure which do not depart from the scope of the appended claims.

Figure 1:
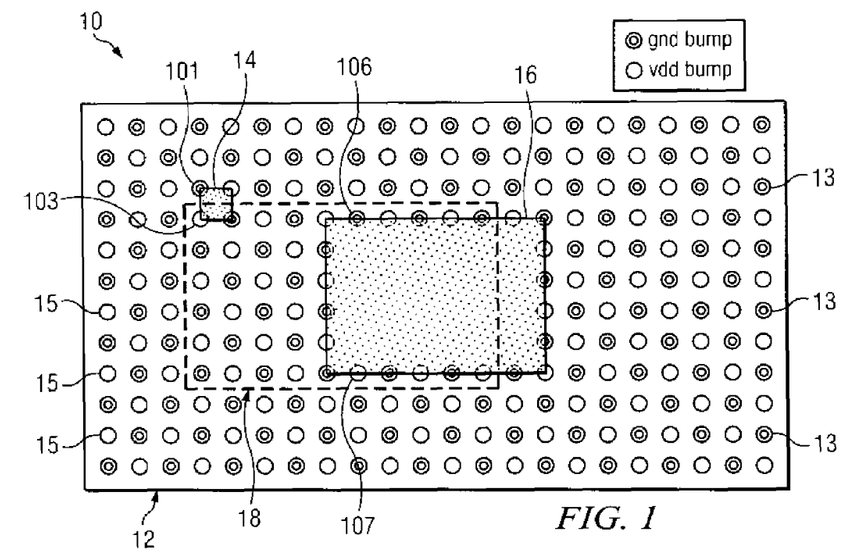
FIG. 1 is a diagram illustrating a semiconductor device with connection-bumps.

FIG. 1 is a diagram illustrating one embodiment of a semiconductor device with connection-bumps. Shown in FIG. 1 is a plan view of a semiconductor device 10 having a die edge 12. A semiconductor device may also be referred to as a die. The device features of die 10 are contained within die edge 12. Numerous connection-bumps 13 and 15 are shown within die edge 12. Not shown are all other various device features of semiconductor device 10. These other various device features are usually fabricated within their respective various process layers prior to the fabrication of connection-bumps 13 and 15.

Semiconductor device 10 may include a microprocessor. Further, semiconductor device 10 may be a multi-core microprocessor (e.g., a microprocessor having multiple processing units). Semiconductor device 10 may operate at frequencies of greater than about 1 GHz. Semiconductor device 10 may be fabricated using any number of process technologies. In particular, semiconductor device 10 may be fabricated with a process technology having a minimum half pitch of less than about 90 nm.

Semiconductor device 10 may be incorporated into a package prior to use in an electronic device. Connection bumps 13 and 15 enable the semiconductor device to be electrically coupled to a package. Such a package includes electrical leads which enable the package to be electrically coupled with an electrical device. In this manner, a packaged semiconductor device may be in electrical communication with an electronic device. Thus, packaging enables the semiconductor device to be incorporated into and used by an electronic device.

As electrical coupling with an electronic device is enabled via connection bumps 13 and 15, it follows that connection bumps 13 and 15 may hold electric potential and/or may carry electric current. Thus, connection-bumps may include power connection-bumps which hold electric potential and signal connection-bumps which carry electric signals. Connection bumps 13 and 15 may be considered power connection-bumps. Connection-bumps 13 and 15 include VDD bumps 15, where VDD may be the power supplied to the semiconductor device 10. The conductors configured to supply VDD to semiconductor device 10 may be referred to collectively as a power network. The power network may include conductors arranged throughout semiconductor device 10. It is desirable to maintain a stable voltage on the power network. Connection-bumps 13 and 15 also include GND bumps 13, where GND may be the common ground for the semiconductor device 10. It is noted that the plan view of FIG. 1 shows the connection-bumps 13 and 15 themselves, but not underlying features to which the connection-bumps 13 and 15 may be connected.

Connection-bumps 13 and 15 may be arranged around a periphery of a semiconductor device to facilitate device packaging. Consequently, VDD bumps 15 and GND bumps 13 are shown arranged around the periphery of semiconductor device 10. Due to packaging restrictions, some semiconductor areas may be free from connection-bumps 13 and 15. For example, to stabilize power operation of the semiconductor device, a packaged semiconductor device may have extra capacitors arranged on the package outside the die. Such arrangement may lead to connection-bump placement restrictions. Consequently, semiconductor device 10 is shown having an area without VDD bumps 15 and GND bumps 13.

Semiconductor device 10 may include dense area 14 and sparse area 16, where dense and sparse refer to density of connection bumps 13 and 15. As will be discussed below in further detail, areas may be defined as dense or sparse using a variety of methods. However, in general within the same semiconductor device, a sparse area has at least one corresponding dense area. A dense area has connection bumps arranged at regularly spaced intervals along an axis. The regularly spaced intervals may be user-defined. A sparse area has connection bumps having at least some spaced intervals along the same axis which exceed the regularly spaced intervals of a corresponding dense area.

For example, the connection-bumps arranged closest to one another along at least one axis of a sparse area are further apart than the maximum distance between connection-bumps along either axis in a corresponding dense area. In particular, dense area 14 is defined, in part, by the connection bumps GND bump 101 and VDD bump 103. Connection bumps GND bump 101 and VDD bump 103 are arranged along a y-axis and immediately adjacent one another. As shown, GND bump 106 and VDD bump 107 are also arranged along a y-axis and immediately adjacent one another, yet are spaced at a distance greater than that between GND bump 101 and VDD bump 103. Consequently, GND bump 106 and VDD bump 107 define, in part, a sparse area.

As noted, connection-bumps 13 and 15 electrically couple semiconductor device 10 with its respective package. In this manner, packaged semiconductor device 10 may be in electrical communication with an electronic device. Thus, connection-bumps 13 and 15 provide electric potentials used by semiconductor device 10. Within semiconductor device 10, electric potentials may be routed through various conductors. Such conductors may be electrically coupled to connection-bumps 13 and 15 and may include contacts, vias, and interconnects.

Contacts and vias allow electrical coupling between layers of the semiconductor device. Thus, with respect to a wafer surface upon which semiconductor device 10 is fabricated, contacts and vias may have a substantially vertical orientation. Interconnects allow electrical coupling from one die area to another and may therefore have a substantially horizontal orientation. Interconnects may also be referred to as metal lines.

Figure 2:
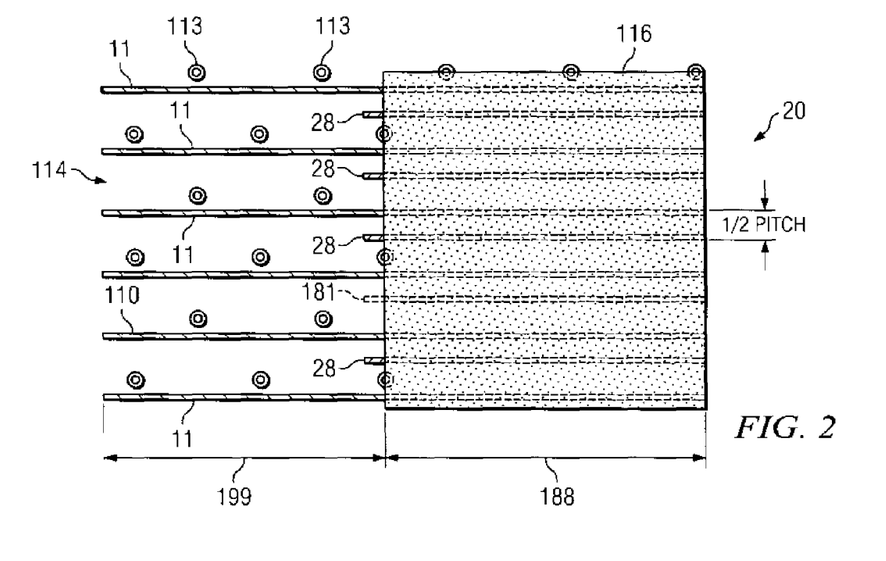
FIG. 2 is a diagram illustrating one embodiment of a metal line configuration according to the invention.
Figure 3:
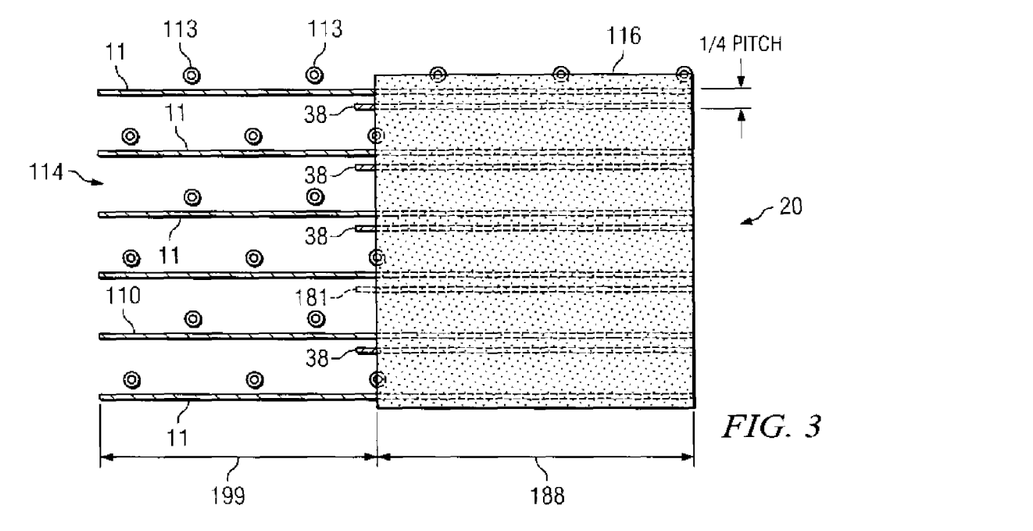
FIG. 3 is a diagram illustrating another embodiment of a metal line configuration according to the invention.
Figure 4:
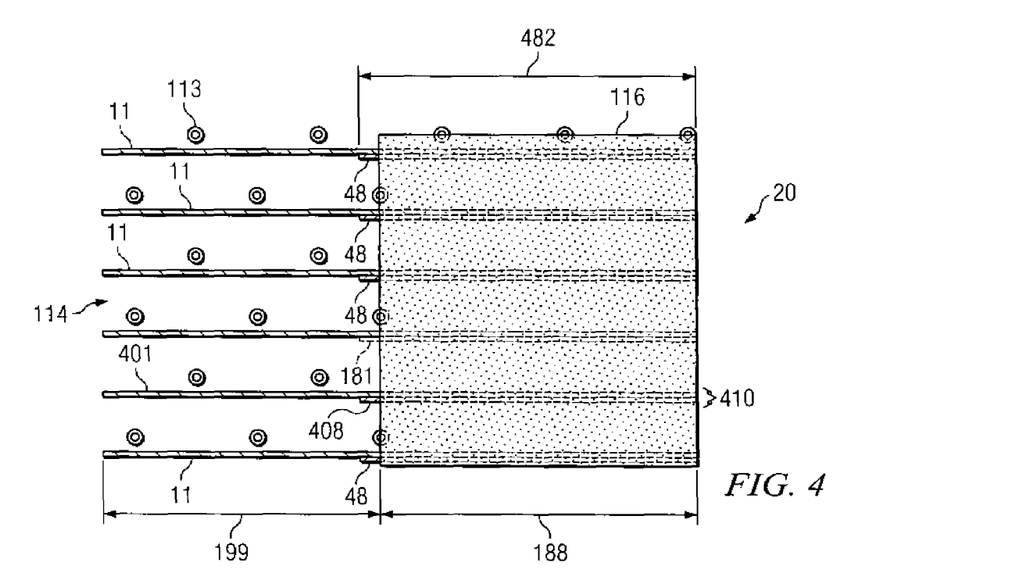
FIG. 4 is a diagram illustrating yet another embodiment of a metal line configuration according to the invention.

FIGS. 2-4 are diagrams illustrating respective embodiments of metal line configurations in accordance with the invention. Shown in FIGS. 2-4 is metal layer 20. Metal layer 20 includes a magnified view of a portion of semiconductor device 10 approximated by exemplary area 18 of FIG. 1. However, where FIG. 1 is a plan view of die 10 illustrating placement of GND bumps 13 and VDD bumps 15, FIGS. 2-4 illustrate a plan view of metal layer 20 indicating placement of metal lines 11 and GND vias 113. It is noted that a GND via 113 may be in a position within metal layer 20 which is substantially commensurate with a position of a corresponding GND bump 13 fabricated on a subsequent layer. Thus, FIGS. 2-4 illustrate at least some features which may be underlying and/or electrically coupled to the GND bumps 13 and/or the VDD bumps 15 illustrated in FIG. 1.

The metal layer indicated in FIGS. 2-4 includes metal lines 11. Metal lines 11 are functional metal lines. Functional metal lines are those lines used for the logical functioning of the semiconductor device. Logical functioning may include supplying power and transmitting signals. Thus, functional metal lines 11 may provide power to semiconductor device 10. For example, logic gates may be electrically coupled to VDD by way of metal lines 11. A logic gate may become operational upon application of a certain voltage level (e.g. VDD) provided by metal lines 11. Semiconductor device 10 is designed such that metal lines 11 may deliver proper voltage levels to logic gates. However, increased impedance of metal lines 11 may cause increased voltage drops over metal line lengths. Proper operation of logic gates within semiconductor device 10 may therefore be dependent upon conductor impedance. Consequently, impedance of metal lines 11 may affect the logical functioning of semiconductor device 10.

Impedance of metal lines 11 shown in FIGS. 2-4 may be adversely affected by the presence and/or operation of connection bumps including GND bumps 13 and VDD bumps 15, shown in FIG. 1. Referring to FIGS. 2-4, consider exemplary functional metal line. 410 including a section labeled 199 and a section labeled 188. Section 199 of metal line 401 traverses dense area 114 of metal layer 20 while section 188 of metal line 410 traverses sparse area 116 of metal layer 20. The physical width and/or cross-sectional area of section 188 is substantially equivalent to the width and/or cross-sectional area of section 199. Thus, it may be desired that the impedance of section 188 is substantially equivalent to the impedance of section 199. However, the impedance of section 199 is not substantially equivalent to the impedance of section 188 due to respective connection bump densities in proximity to the respective sections without additional impedance-reducing conductor 488. In particular, the impedance of section 199 traversing dense area 114 may be substantially less than the impedance of section 188 traversing sparse area 116 without additional impedance-reducing conductor 488.

Various embodiments for reducing impedance variation are described in detail below. In general, impedance variation is ameliorated by adding impedance-reducing conductors to conductive layers. Impedance-reducing conductors may be added in attempt to normalize conductive-material density across the respective conductive layer. Alternately, impedance-reducing conductors may be added to normalize any one of a number of electro-magnetic properties. For example, impedance-reducing conductors may be added such that parasitic capacitance is constant across a metal process layer of a die. Consequently, impedance-reducing conductors may or may not be distributed periodically across sparse area 116. For example, location 181 may not include an impedance-reducing conductor as impedance or other electro-magnetic properties may be normalized without adding impedance-reducing conductors to some locations.

FIG. 2 is a diagram illustrating one embodiment of a metal line configuration according to the invention. Impedance matching may be obtained by adding conductive material (e.g., metal) to a sparse area of metal layer 20, where sparse area 116 is shown to have a lower density of GND vias 113. Impedance-reducing metal lines 28 are added to the sparse area 116 of metal layer 20 to provide impedance matching. For example, impedance matched metal lines 11 may be attained by adding impedance-reducing metal lines 28.

Impedance-reducing metal lines 28 may be added as necessary to achieve impedance matching. Therefore, the width of impedance-reducing metal lines 28 may not necessarily match the width of functional metal lines 11.

Further, the width of impedance-reducing metal lines 28 may not be constant. Each impedance-reducing metal line 28 may have a different line width. Furthermore, a single impedance-reducing metal line 28 may have a varying line width. A single impedance-reducing metal line 28 may have a line width that varies deliberately from one section of the line to another.

Impedance-reducing metal lines 28 may be added to sparse area 116 of metal layer 20 and arranged in relationship with adjacent functional metal lines 11 such that regular spacing exists between the functional metal lines 11 and the impedance-reducing metal lines 28. Impedance-reducing metal lines 28 are added to sparse area 116 of metal layer 20, spaced more or less equidistant between flanking functional metal lines 11. Thus, impedance-reducing metal lines 28 are added approximately halfway between functional metal lines 11. Therefore, metal lines 28 may be referred to as having a ½ pitch arrangement with respect to functional metal lines 11.

FIG. 3 is a diagram illustrating another embodiment of a metal line configuration according to the invention. Impedance-reducing metal lines 38 are added to the sparse area 116 of metal layer 20 to provide impedance matching. A distinction between impedance-reducing metal lines 38 and impedance-reducing metal lines 28 described above in reference to FIG. 2 is the spacing of the impedance-reducing metal lines 38 with respect to functional metal lines 11.

The embodiment shown in FIG. 3 is similar to the embodiment shown in FIG. 2 with the exception of the arrangement of impedance-reducing metal lines 38. Impedance-reducing metal lines 38 are added to sparse area 116 of metal layer 20 such that impedance-reducing metal lines 38 are not arranged substantially equidistant between adjacent metal lines 11. As shown, impedance-reducing metal lines 38 are arranged approximately one fourth of the way between adjacent functional metal lines 11. Therefore, metal lines 38 may be referred to as having a ¼ pitch arrangement with respect to functional metal lines 11.

As described above, impedance matching conductive material may be added to semiconductor device 10 at any number of layers. Such conductive material may be added for conductive density matching and/or electro-magnetic matching across all conductive layers. The ¼ pitch placement of impedance-reducing metal lines 38 may facilitate placement of impedance-matching features on other conductive layers. For example, assume semiconductor device 10 includes impedance-reducing metal lines 28 and impedance-reducing metal lines 38. In addition to these added impedance-reducing metal lines, another impedance-reducing metal line may be arranged at ¾ pitch. Such arrangement could result in three equally spaced impedance-reducing metal lines arranged laterally between functional metal lines 11.

Because impedance-reducing features may be added to any or all conductive layers, added impedance-reducing features may not be limited to a single metal layer (i.e., a first metal layer may have impedance-reducing metal lines arranged at ¼ pitch, a second metal layer may have impedance-reducing metal lines arranged at ½ pitch, and a third metal layer may have impedance-reducing metal lines arranged at ¾ pitch.) Further, the functional metal line pitches of each layer may or may not be equivalent. Thus, impedance-reducing metal lines may be added at any metal layer having any desired pitch. Further, in addition to areas devoid of added conductive material such as area 181, the pitch of added impedance-reducing metal lines may vary within a single process layer. Therefore, impedance-reducing metal lines need not be equally spaced.

FIG. 4 is a diagram illustrating yet another embodiment of a metal line configuration according to the invention. Again, impedance matching may be obtained by adding conductive material (e.g., metal) to a sparse area of metal layer 20, where sparse area 116 is shown to have a lower density of GND vias 113. Also, some similarities with respect to the embodiments shown in FIG. 2 and FIG. 3 may exist. However, this embodiment includes adding conductive material such that the effective line width of functional metal lines 11 is wider across sparse area 116.

The metal layer shown in FIG. 4 includes metal lines 11 having supplemental metal line portions 48. As shown, metal lines 11 and impedance-reducing metal line portions 48 are distinct lines in direct contact with one another, thus yielding an effective line width which varies over the length of metal line 11. However, in practice, a metal line 11 may be fabricated having an integral section which is wider than other sections of line 11.

As shown, metal line 410 is a functional metal line 401 arranged having a lateral edge substantially commensurate with a lateral edge of an impedance-reducing metal line portion 408. The effective width of metal line 410 traversing sparse area 116 along the length labeled 482 is substantially wider than the remaining length of metal line 410 traversing dense area 114. Due to the effects of connection bumps on impedance, the impedance of section 488 may be substantially equivalent to the impedance of section 499 due to the varying effective widths of the sections. However, as noted above, in practice metal line 410 may be fabricated as a single functional metal line 410 having a wider width along the section 482. Regardless of fabrication method, the result is functional metal lines such as metal line 410 which have impedance in one section, such as section 499, which substantially matches the impedance in another section traversing an area with a different connection bump density, such as section 488.

FIGS. 5-8 are diagrams illustrating exemplary dense areas and exemplary sparse areas. Shown in FIGS. 5-8 are respective plan views of semiconductor device 10 having die edge 12. The periphery of semiconductor device 10 is near die edge 12 and includes any dense areas. Connection-bumps including VDD bumps 15 and GND bumps 13 are arranged densely around the periphery of semiconductor device 10. In semiconductor device 10, connection-bumps VDD bumps 15 and GND bumps 13 are arranged sparsely near the center, where the center includes any sparse areas. Embodiments of methods to differentiate connection-bump density according to the invention will be described.

A dense area may be user-defined, and a sparse area may be defined as an area which has a density of connection bumps which is less than that of the defined dense area. A dense area may be determined by the spacing of connection-bumps such as GND bumps 13 and/or VDD bumps 15. For example, a dense area may be defined by a quadrilateral of nearest adjacent GND bumps 13 along x and/or y axes.

Figure 5:
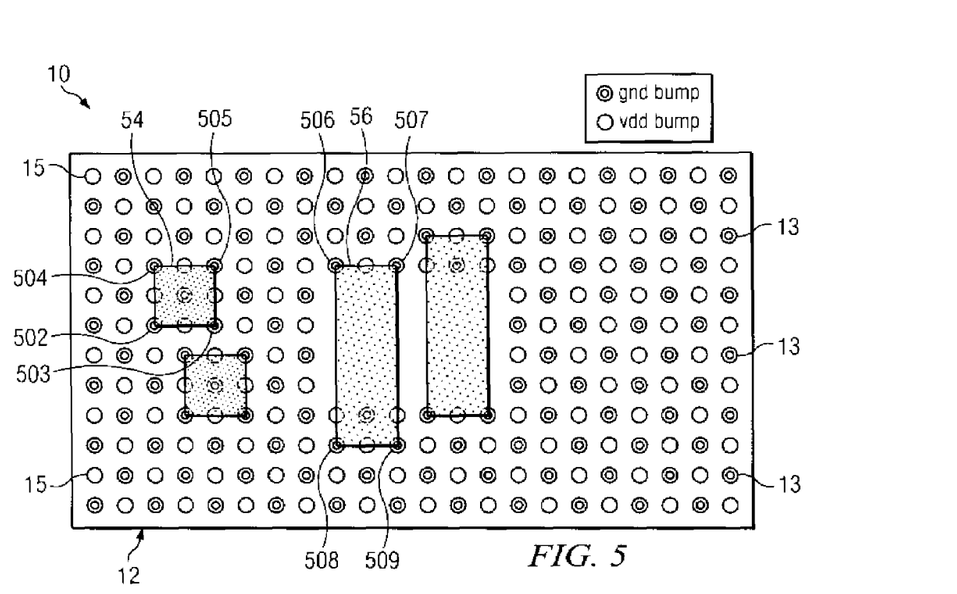
FIG. 5 is a diagram illustrating one method to differentiate connection-bump density according to the invention.

Referring to FIG. 5 in particular, dense area 54 may be defined by GND bumps 504, 505, 502, and 503. To be considered a dense area in this embodiment, a distance between GND bumps along an x-axis may not substantially exceed the distance between GND bump 504 and GND bump 505. Similarly, to be considered a dense area in this embodiment, a distance between GND bumps 13 along a y-axis may not substantially exceed the distance between GND bump 504 and GND bump 502. As shown, the distance along the y-axis between adjacent GND bumps 506 and 508 of sparse area 56 significantly exceeds those of dense area 54.

Figure 6:
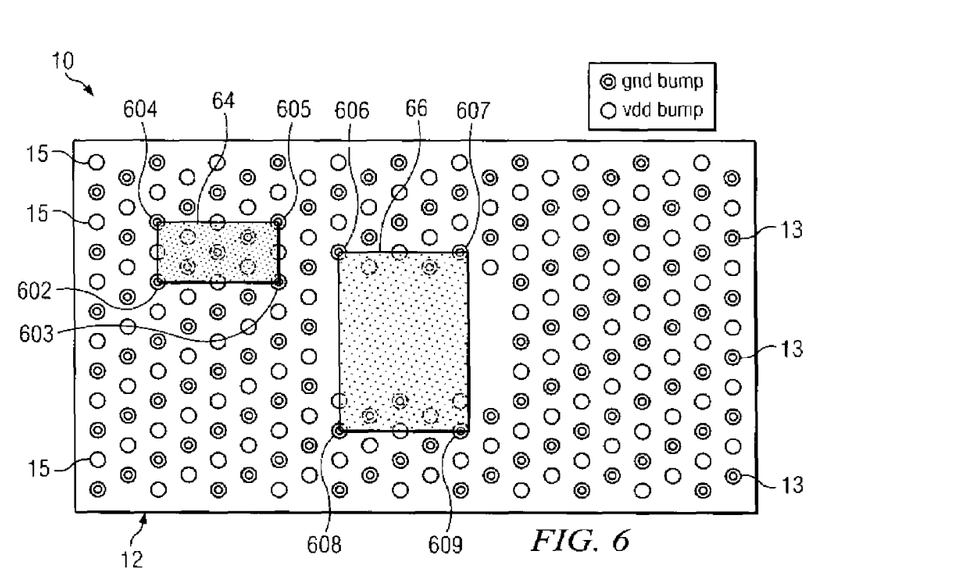
FIG. 6 is a diagram illustrating another method to differentiate connection-bump density according to the invention.

FIG. 6 is a diagram illustrating yet another method to differentiate connection-bump density according to the invention. An exemplary dense area 64 and an exemplary sparse area 66 are shown.

Dense area 64 is defined by a quadrilateral of nearest adjacent GND bumps 13 along x and y axes. In particular, dense area 64 is defined by GND bumps 604, 605, 602, and 603. Because the distances along x and y axes of GND bumps 606, 607, 608, and 609 exceeds those of dense area 64, area 66 is a sparse area. However, because dense area 64 is defined by distance between GND bumps along x and y axis, dense area 64 may also be defined by an area circumscribed by nearest adjacent GND bumps 13 along x and y axes.

Figure 7:
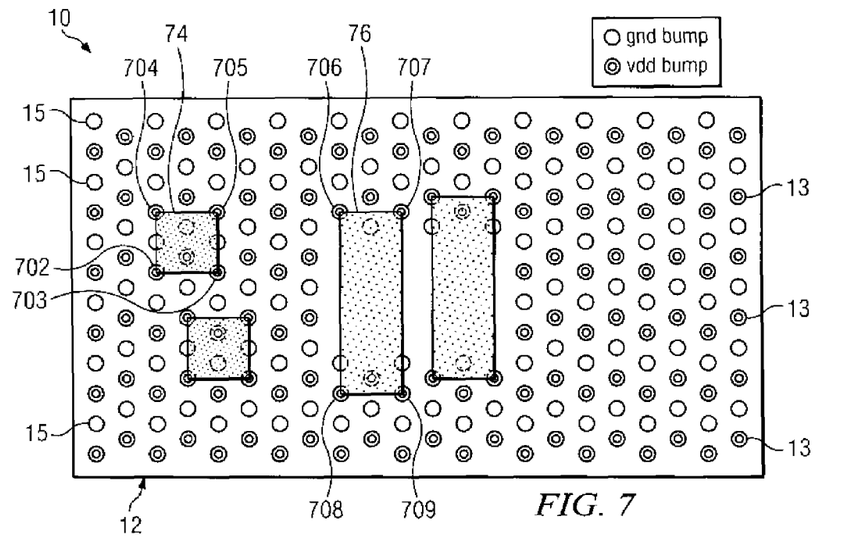
FIG. 7 is a diagram illustrating yet another method to differentiate connection-bump density according to the invention.

FIG. 7 is a diagram illustrating yet another method to differentiate connection-bump density according to the invention. An exemplary dense area 74 and an exemplary sparse area 76 are shown. In contrast to dense areas 54 and 64 in FIGS. 5 and 6, respectively, dense area 74 has laterally adjacent GND bumps 13 which are not necessarily separated from one another by VDD bumps 15. As shown, GND bumps 704 and 705 are not separated from one another using a VDD bump 15. In particular, dense area 74 may be defined by GND bumps 704, 705, 702, and 703. For an area to be considered a dense area, a distance between GND bumps along an x-axis may be equivalent to the distance between GND bump 704 and GND bump 705. Similarly, a distance between GND bumps along a y-axis may be equivalent to the distance between GND bump 704 and GND bump 702. As shown, along the y-axis the distance between adjacent GND bumps 706 and 708 exceeds that of dense area 74 along the y-axis. Therefore, area 76 defined by GND bumps 706, 707, 709 and 708 is a sparse area.

Figure 8:
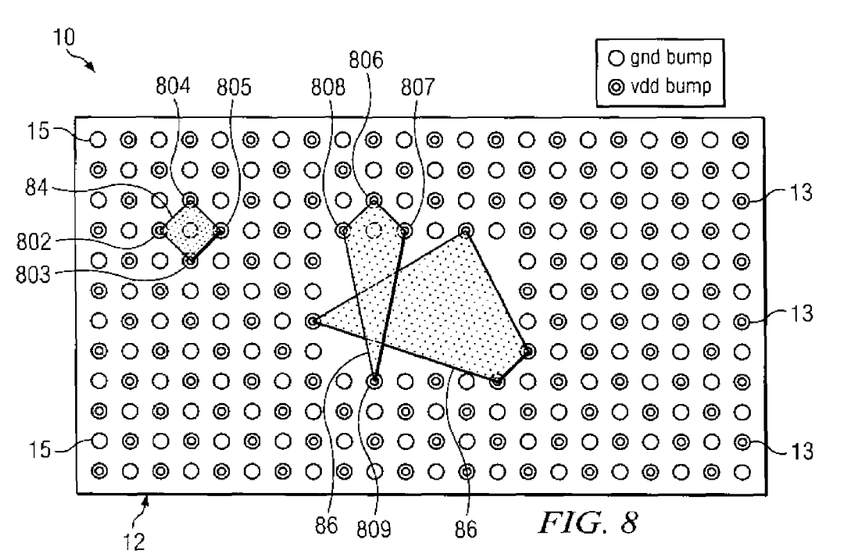
FIG. 8 is a diagram illustrating yet another method to differentiate connection-bump density according to the invention.

FIG. 8 is a diagram illustrating another method to differentiate connection-bump density according to the invention. An exemplary dense area 84 and an exemplary sparse area 86 are shown. In this embodiment, a dense area may be determined by a quadrilateral of nearest GND bumps 13 where the nearest GND bump can be either an absolute nearest GND bump or the nearest GND bump not arranged along either the x or y axis. For example, the nearest GND bump arranged along xy or −xy diagonal axes.

In particular, dense area 84 may be defined by GND bumps 804, 805, 802, and 803. In this embodiment, an area may be considered a dense area if a distance between GND bumps arranged along a −xy diagonal does not exceed the distance between GND bumps 804 and 805. Similarly, an area may be considered a dense area if a distance between GND bumps along an xy diagonal does not exceed the distance between GND bumps 804 and 802. As shown, the distance between GND bumps arranged along xy diagonal 809 and 807 and those along −xy diagonal 808 and 809 of sparse area 86 exceeds those of dense area 84. Also, the slope of the respective xy and −xy diagonals between the respective areas 84 and 86 are non-matching. Therefore, either distance or slope between nearest adjacent GND bumps 13 may be used to define an area as either sparse or dense.

Determination of dense and/or sparse areas may be made by examination of the distribution of connection-bumps. A dense area may be defined by distance between nearest adjacent GND bumps 13 along x and y axes, or by area circumscribed by nearest adjacent GND bumps 13 along x and y axes, or by distances between GND bumps along user-defined axis, or even by slopes of diagonal lines defined by nearest adjacent GND bumps. Hence, a dense area may be user-defined using any of a number of criteria.

Further, using user-defined criteria, connection-bump density may be determined through use of any one of a number of software packages. For example, a software package for determining semiconductor layouts may also be used to determine connection bump density. Consequently, determination of dense areas and/or sparse areas may be performed automatically using software to determine spacing between connection bumps GND 13 and/or VDD 15. Such determination may be made from an algorithm including any combination of methodologies for determining dense areas presented above, among others. Further, dense or sparse may not necessarily be the only area designations. For example, relative or weighted area densities may be determined and/or compensated with impedance-reducing conductors. Furthermore, compensation conductor layouts may be similarly automated through use of such software packages.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. A semiconductor die with reduced impedance variation comprising:
   a set of connection bumps on the semiconductor die, the set of connection bumps arranged in a dense area having a first density of connection bumps and a sparse area having a second density of connection bumps less than the first density;
   at least one functional conductor within the semiconductor die; and
   at least one impedance-reducing conductor within the semiconductor die, wherein the at least one impedance-reducing conductor is configured to reduce impedance variation of the at least one functional conductor and the at least one impedance-reducing conductor is arranged substantially within the sparse area of connection bumps.

2. The semiconductor device as recited in claim 1, wherein the at least one functional conductor is configured to hold an electric potential.

3. The semiconductor device as recited in claim 2, wherein the at least one functional conductor comprises a plurality of functional metal lines.

4. The semiconductor device as recited in claim 3, wherein:
   the at least one impedance-reducing conductor comprises a plurality of impedance-reducing conductors, and wherein
   the plurality of impedance-reducing conductors is not equally distributed across the semiconductor device.

5. The semiconductor device as recited in claim 4, wherein at least one of the plurality of impedance-reducing conductors is configured to hold an electric potential.

6. The semiconductor device as recited in claim 5, wherein:
   the plurality of impedance-reducing conductors comprises impedance-reducing metal lines, and wherein
   the impedance-reducing metal lines are arranged lateral to and substantially parallel with functional metal lines.

7. The semiconductor device as recited in claim 6, wherein the semiconductor device operates at frequencies greater than about 1 GHz.

8. The semiconductor device as recited in claim 6, wherein:
   each impedance-reducing metal line has a corresponding functional metal line, and wherein
   each impedance-reducing metal line has a lateral edge substantially commensurate with a lateral edge of its corresponding functional metal line.

9. The semiconductor device as recited in claim 8, wherein each impedance-reducing metal line is substantially integral with its corresponding functional metal line.

10. The semiconductor device as recited in claim 6, wherein impedance-reducing metal lines are arranged at a substantially ½ pitch with respect to adjacent functional metal lines.

11. The semiconductor device as recited in claim 6, wherein impedance-reducing metal lines are arranged at a substantially ¼ pitch with respect to adjacent functional metal lines.

12. The semiconductor device as recited in claim 6, wherein the semiconductor device is fabricated with a process technology capable of a minimum half pitch of less than about 90 nm.

13. The semiconductor device as recited in claim 6, wherein the semiconductor device comprises a multi-core microprocessor.

14. A semiconductor die with reduced impedance variation comprising:
    a plurality of connection-bumps comprising at least one connection-bump configured to hold an electric potential;
    a dense area comprising a first density of connection bumps;
    a sparse area comprising a second density of connection bumps which is less than the first density of connection bumps in the dense area;
    a plurality of functional metal lines within the semiconductor die comprising at least one functional metal line configured to hold an electric potential; and
    a plurality of impedance-reducing conductors within the semiconductor die configured to reduce impedance variation of at least one functional metal line wherein the at least one of the plurality of impedance-reducing conductor is arranged substantially within the sparse area of connection bumps.

15. The semiconductor device as recited in claim 14, wherein the semiconductor device operates at frequencies greater than about 1 GHz.

16. The semiconductor device as recited in claim 14, wherein the semiconductor device is fabricated with a process technology capable of a minimum half pitch of less than about 90 nm.

17. The semiconductor device as recited in claim 14, wherein the semiconductor device comprises a multi-core microprocessor.

18. The semiconductor device as recited in claim 14, wherein the impedance-reducing conductors comprise impedance-reducing metal lines arranged:
    substantially parallel with adjacent functional metal lines; and
    substantially within the sparse area.

19. The semiconductor device as recited in claim 18, wherein each impedance-reducing metal line is arranged substantially equidistant from a corresponding adjacent functional metal line.

20. The semiconductor device as recited in claim 19, wherein each impedance-reducing conductor is substantially integral with a corresponding functional metal line.

21. A method of reducing impedance variation in a semiconductor die, the method comprising:
    forming a set of connection bumps on the semiconductor die, the set of connection bump a arranged in a dense area having a first density of connection bumps and a sparse area having a second density of connection bumps less than the first density;
    forming at least one functional conductor within the semiconductor die; and
    forming at least one impedance-reducing conductor within the semiconductor die, wherein the at least one impedance-reducing conductor is configured to reduce impedance variation of the at least one functional conductor and the at least one impedance-reducing conductor is arranged substantially within the sparse area of connection bumps.

22. The method as recited in claim 21, wherein forming the at least one functional conductor comprises forming a plurality of functional metal lines, and wherein the at least one impedance-reducing conductor is configured to reduce impedance of at least one of the plurality of functional metal lines.

23. The method as recited in claim 22, further comprising forming a microprocessor including at least some of the plurality of functional metal lines, wherein the microprocessor is configured to operate at frequencies greater than about 1 GHz.

24. The method as recited in claim 23, wherein forming the microprocessor further comprises forming multiple cores.

25. The method as recited in claim 24, wherein forming the microprocessor further comprises fabricating the microprocessor with a process technology capable of a minimum half pitch of less than about 90 nm.

26. The method as recited in claim 25, wherein forming the at least one impedance-reducing conductor comprises forming a plurality of impedance-reducing conductors, wherein the plurality of impedance-reducing conductors are not equally distributed across the semiconductor device.

27. The method as recited in claim 26, further comprising forming connection-bumps, wherein the connection bumps are not equally distributed across the semiconductor device.

28. The method as recited in claim 27, further comprising:
    forming at least one dense area having a density of connection bumps; and
    forming at least one sparse area having a density of connection bumps which is less than the density of connection bumps in the dense area,
    wherein forming impedance-reducing conductors comprises arranging impedance-reducing conductors, wherein each impedance-reducing conductor is arranged substantially within a corresponding sparse area.

29. The method as recited in claim 28, wherein:
    forming the plurality of impedance-reducing conductors comprises forming impedance-reducing metal lines, and wherein
    forming the impedance-reducing metal lines comprises arranging the impedance-reducing metal lines lateral to and substantially parallel with adjacent functional metal lines.

30. The method as recited in claim 29, wherein forming the impedance-reducing metal lines comprises arranging at least one impedance-reducing metal line at a substantially ½ pitch with respect to a corresponding functional metal lines.

31. The method as recited in claim 29, wherein forming the impedance-reducing metal lines comprises arranging at least one impedance-reducing metal line at a substantially ¼ pitch with respect to a corresponding functional metal lines.

32. The method as recited in claim 29, wherein forming the impedance-reducing metal lines comprises:
    forming a corresponding functional metal line for each impedance-reducing metal line; and
    arranging each impedance-reducing metal line wherein a lateral edge of the impedance-reducing metal line is substantially commensurate with a lateral edge of its corresponding functional metal line.

33. The method as recited in claim 32, wherein forming impedance-reducing metal lines comprises substantially integrating each impedance-reducing metal line with its corresponding functional metal line.

* * * * *